United States Patent
Ikeda et al.

(10) Patent No.: US 6,858,971 B2
(45) Date of Patent: Feb. 22, 2005

(54) PIEZOELECTRIC/ELECTROSTRICTIVE DEVICE

(75) Inventors: Koji Ikeda, Hisai (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 98 days.

(21) Appl. No.: 10/236,865

(22) Filed: Sep. 6, 2002

(65) Prior Publication Data

US 2003/0062806 A1 Apr. 3, 2003

Related U.S. Application Data

(60) Provisional application No. 60/322,185, filed on Sep. 11, 2001.

(51) Int. Cl.[7] .............................................. H01L 41/08
(52) U.S. Cl. ...................................... 310/331; 310/332
(58) Field of Search ........................ 310/328, 330–332, 310/358, 366

(56) References Cited

U.S. PATENT DOCUMENTS

| | | | |
|---|---|---|---|
| 3,590,287 A | * 6/1971 | Berlincourt et al. | ........ 310/321 |
| 4,612,440 A | 9/1986 | Brunnee et al. | |
| 5,237,239 A | 8/1993 | Inoue et al. | |
| 5,300,852 A | * 4/1994 | Isogai et al. | ................ 310/358 |
| 5,500,777 A | 3/1996 | Hasegawa et al. | |
| 5,507,898 A | * 4/1996 | Aoki et al. | ............... 156/89.14 |
| 6,445,111 B2 | * 9/2002 | Watanabe et al. | ........... 310/358 |
| 6,455,981 B1 | 9/2002 | Takeuchi et al. | |
| 6,476,539 B1 | * 11/2002 | Takeuchi et al. | ............. 310/330 |
| 6,590,316 B2 | * 7/2003 | Koike et al. | ................ 310/358 |

FOREIGN PATENT DOCUMENTS

| JP | 2-262383 | 10/1990 |
|---|---|---|
| JP | 2001320103 A | 11/2001 |

* cited by examiner

*Primary Examiner*—Mark Budd
(74) *Attorney, Agent, or Firm*—Burr & Brown

(57) ABSTRACT

A piezoelectric/electrostrictive device has a piezoelectric/electrostrictive element which is formed on a ceramic substrate. The ceramic substrate includes a plate section, a movable section, and a fixed section. The piezoelectric/electrostrictive element has one electrode and the other electrode which are alternately stacked to give a comb-shaped cross section while the one electrode and the other electrode are superimposed with each other with piezoelectric/electrostrictive layers interposing therebetween. The first layer of the piezoelectric/electrostrictive layers includes a first portion of a first piezoelectric/electrostrictive material formed over a region ranging from a part of the thin plate section to a part of the fixed section, and a second portion of a second piezoelectric/electrostrictive material formed on another part of the fixed section.

15 Claims, 11 Drawing Sheets

PIEZOELECTRIC/ELECTROSTRICTIVE DEVICE

BACKGROUND OF THE INVENTION

1. Field of the Invention

The present invention relates to a piezoelectric/electrostrictive device which has at least a stacked type piezoelectric/electrostrictive element formed by a film formation method on a ceramic substrate. The element has a structure in which piezoelectric/electrostrictive layers and electrode layers including piezoelectric/electrostrictive materials are alternately laminated in a comb shape.

2. Description of the Related Art

A piezoelectric/electrostrictive device such as an actuator element or a sensor element using a piezoelectric/electrostrictive layer is produced as follows. A wiring pattern made of a first electrode layer is formed on a ceramic substrate by printing, for example. A piezoelectric/electrostrictive layer is further formed thereon by printing, followed by sintering to fix the layer. After that, a wiring pattern made of another electrode layer is formed (see, for example, Japanese Laid-Open Patent Publication No. 2001-320103).

The piezoelectric/electrostrictive device can be used as an actuator element in which an electric field is applied to the piezoelectric/electrostrictive layer by supplying an electric signal to the wiring pattern so that the piezoelectric/electrostrictive layer is consequently displaced. The device also can be used as a sensor element. In the sensor element, an electric signal generated depending on the pressure applied to the piezoelectric/electrostrictive layer is outputted from the wiring pattern.

In the piezoelectric/electrostrictive device as described above, when the electrode layers and the piezoelectric/electrostrictive layers are alternately formed on the ceramic substrate to form a multilayered piezoelectric/electrostrictive driving section, a part of one electrode layer is protruded outwardly from a portion substantial operating section) which functions as an actual driving section (or a sensing section), because it is necessary to form a connecting terminal on the part of the electrode layer. In this structure, in order to avoid a short circuit between the part of the electrode layer (protruding portion) and another electrode layer, the piezoelectric/electrostrictive layer is also protruded in conformity with the part of the electrode layer.

However, in the above structure, an unnecessary electrostatic capacity is formed by the part of the electrode film, the protruding piezoelectric/electrostrictive layer, and the other electrode film. As a result, a CR time constant concerning supply of an electric signal may be consequently increased (a response rate may be lowered).

SUMMARY OF THE INVENTION

It is an object of the present invention to overcome the above discussed problems. The present invention provides a piezoelectric/electrostrictive device in which optimum device characteristics can be realized depending on the use. For example, mechanical characteristics or electric characteristics can be varied between a substantial operating section and another portion, in such a manner that electrostatic capacity can be increased in the substantial operating section, and electrostatic capacity can be decreased in the other portion.

According to the present invention, there is provided a piezoelectric/electrostrictive device comprising a piezoelectric/electrostrictive element including one or more piezoelectric/electrostrictive layers and one or more electrode layers alternately laminated on a ceramic substrate. At least on of the piezoelectric/electrostrictive layers includes two or more types of materials which are arranged next to each other.

Accordingly, for example, when a connecting terminal is formed on a part of the electrode layer, the part of the electrode layer may be protruded outwardly from a portion (substantial operating section) which functions as an actual driving section (or a sensing section). In this case, the piezoelectric/electrostrictive layer is also protruded in conformity with the part of the electrode layer, in order to avoid any short circuit between the part of the electrode layer (protruding portion) and another electrode layer.

In this structure, the present invention makes it possible to realize that the portion of the piezoelectric/electrostrictive layer which interposes between the part of the electrode layer and another electrode layer is made from a material having a low dielectric constant, and the portion corresponding to the substantial operating section is made from a material having a high dielectric constant.

As a result, electrostatic capacity is increased in the substantial operating section, the amount of generated strain is increased in the piezoelectric/electrostrictive layer, and the displacement of the device is advantageously increased. Further, electrostatic capacity is decreased in the portion other than the substantial operating section. Therefore, CR time constant concerning supply of an electric signal is decreased, for example. When the piezoelectric/electrostrictive device is used as an actuator section, it is possible to realize high speed operation of the actuator section.

According to the present invention, the mechanical characteristics or the electric characteristics can be varied between the substantial operating section and the other portions. It is possible to realize optimum device characteristics depending on the use. For example, the electrostatic capacity can be increased in the substantial operating section and the electrostatic capacity can be decreased in the other portions.

It is also preferable for the piezoelectric/electrostrictive device constructed as described above that at least one of the piezoelectric/electrostrictive layers includes two or more types of piezoelectric/electrostrictive materials which are arranged next to each other.

It is also preferable that the ceramic substrate includes a fixed section which has a large thickness, and a pair of thin plate sections which are formed continuously from the fixed section and each of which has a thickness smaller than that of the fixed section, and the piezoelectric/electrostrictive element is formed on a surface which includes at least a part of one thin plate section of the pair of thin plate sections.

In this arrangement, it is preferable that the piezoelectric/electrostrictive element formed on the surface including the part of at least one of the thin plate sections includes a first piezoelectric/electrostrictive material arranged over a region ranging from the part of the thin plate section to a part of the fixed section and a second piezoelectric/electrostrictive material arranged on another part of the fixed section, and a piezoelectric constant of the second piezoelectric/electrostrictive material is lower than a piezoelectric constant of the first piezoelectric/electrostrictive material.

Specifically, an absolute value of the piezoelectric constant of the first piezoelectric/electrostrictive material is not less than $100 \times 10^{-12}$ m/V, and an absolute value of the piezoelectric constant of the second piezoelectric/electrostrictive material is less than $100 \times 10^{-12}$ m/V. Preferably, the absolute value of the piezoelectric constant of the second piezoelectric/electrostrictive material is not more than $50 \times 10^{-12}$ m/V. More preferably, the absolute value of the piezoelectric constant of the second piezoelectric/electrostrictive material is not more than $10 \times 10^{-12}$ m/V.

It is also preferable that a dielectric constant of the second piezoelectric/electrostrictive material is not more than a dielectric constant of the first piezoelectric/electrostrictive material.

It is also preferable that sensitivity of the second piezoelectric/electrostrictive material to temperature change is lower than that of the first piezoelectric/electrostrictive material.

It is also preferable that a thickness of the layer of the second piezoelectric/electrostrictive material is not less than a thickness of the layer of the first piezoelectric/electrostrictive material.

It is preferable that a boundary between the first piezoelectric/electrostrictive material and the second piezoelectric/electrostrictive material is located on the fixed section, and the boundary is positioned at a distance of not less than d/2 from an intersection between an imaginary extended plane of an inner wall surface of the fixed section and a side surface of the thin plate section provided that d represents a thickness of the thin plate section.

It is also preferable that the piezoelectric/electrostrictive element is constructed by laminating at least two or more of the piezoelectric/electrostrictive layers.

It is also preferable that another layer interposes between the ceramic substrate and the piezoelectric/electrostrictive layer.

It is also preferable that the fixed section and the thin plate section of the ceramic substrate are constructed by sintering a ceramic green laminate into a ceramic laminate, and then cutting off unnecessary portions.

It is also preferable that the fixed section and the thin plate section of the ceramic substrate are constructed by sintering and integrating a ceramic green laminate into a ceramic laminate, thereafter forming the piezoelectric/electrostrictive element on the ceramic laminate followed by sintering, and then cutting off unnecessary portions.

The above and other objects, features, and advantages of the present invention will become more apparent from the following description when taken in conjunction with the accompanying drawings in which a preferred embodiment of the present invention is shown by way of illustrative example.

DETAILED DESCRIPTION OF THE INVENTION

Illustrative embodiments of the piezoelectric/electrostrictive device according to the present invention will be explained below with reference to FIGS. 1 to 11.

The piezoelectric/electrostrictive device 10 of this embodiment includes a piezoelectric/electrostrictive element converting between electric energy and mechanical energy. Therefore, the piezoelectric/electrostrictive device 10 is most preferably used as an active element such as a variety of actuators and vibrators, especially as a displacement element using the inverse piezoelectric effect and the electrostrictive effect. Furthermore, the piezoelectric/electrostrictive device 10 is also preferably used as a passive element such as acceleration sensor elements and shock sensor elements.

Figure 1:
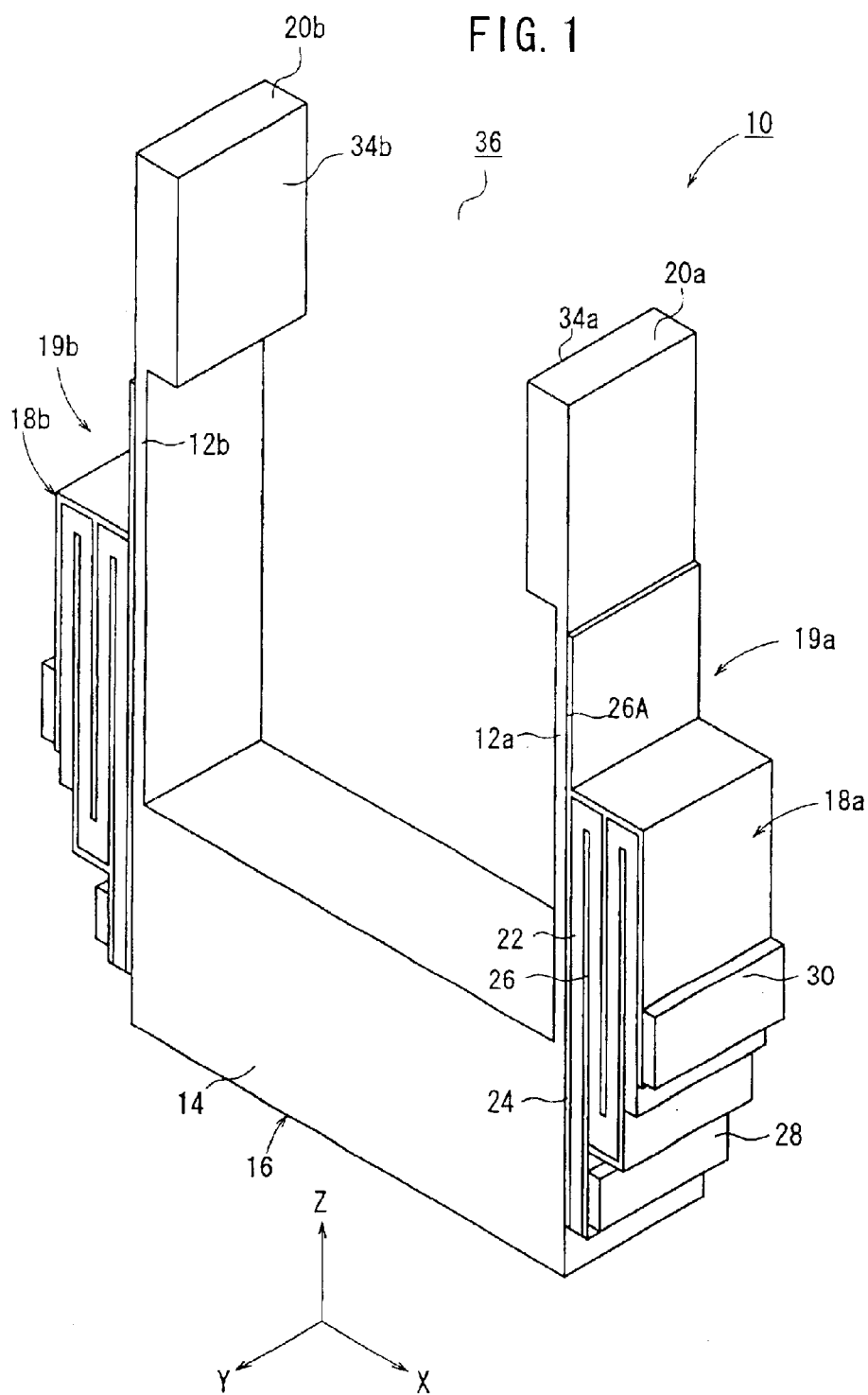
FIG. 1 is a perspective view illustrating an arrangement of a piezoelectric/electrostrictive device of an embodiment according to the present invention.

As shown in FIG. 1, the piezoelectric/electrostrictive device 10 of this embodiment has a ceramic substrate 16 integrally comprising a pair of mutually opposing thin plate sections 12a, 12b, and a fixed section 14 for supporting the thin plate sections 12a, 12b. Piezoelectric/electrostrictive elements 18a, 18b are formed on the pair of thin plate sections 12a, 12b, respectively. Each surface of the thin plate sections 12a, 12b is partly occupied by the respective piezoelectric/electrostrictive elements 18a, 18b.

In the piezoelectric/electrostrictive device 10, the pair of thin plate sections 12a, 12b are displaced in accordance with the driving of the piezoelectric/electrostrictive elements 18a, 18b, or the displacement of the thin plate sections 12a, 12b is detected by the piezoelectric/electrostrictive elements 18a, 18b. Therefore, in the illustrative device shown in FIG. 1, actuator sections 19a, 19b are constructed by the thin plate sections 12a, 12b and the piezoelectric/electrostrictive elements 18a, 18b. Accordingly, the pair of thin plate sections 12a, 12b function as vibrating sections which can be vibrated while supported by the fixed section 14.

Each of ends of the pair of thin plate sections 12a, 12b is inwardly thick-walled. The thick-walled portions function as movable sections 20a, 20b which are displaceable in accordance with the displacing action of the thin plate sections 12a, 12b. The ends of the pair of thin plate sections 12a, 12b are hereinafter referred to as movable sections 20a, 20b.

A gap (air) 36 may be interposed between mutually opposing end surfaces 34a, 34b, of the movable sections 20a, 20b. Alternatively, although not shown, a plurality of members which are made from the same material as, or different materials from, the constitutive material of the movable sections 20a, 20b may be interposed between the end surfaces 34a, 34b. In this arrangement, the mutually opposing end surfaces 34a, 34b of the respective movable sections 20a, 20b function as attachment surfaces 34a, 34b.

The ceramic substrate 16 is a ceramic laminate. For example, several ceramic green sheets are laminated and sintered into the ceramic laminate. This feature will be described later.

The integrated ceramics as described above scarcely suffers from changes over time, because no adhesive exists on joined portions of the respective parts. Therefore, the joined portions are highly reliable, and the structure is advantageous to ensure the rigidity. Further, such integrated ceramics can be produced with ease in accordance with the ceramic green sheet-laminating method as described later.

The piezoelectric/electrostrictive elements 18a, 18b are prepared separately from the ceramic substrate 16 as described later, and are directly formed on the ceramic substrate 16 by the film formation method.

Each of the piezoelectric/electrostrictive elements 18a, 18b comprises a piezoelectric/electrostrictive layer 22, and a pair of electrodes 24, 26 formed on both sides of the piezoelectric/electrostrictive layer 22. The first electrode 24 of the pair of electrodes 24, 26 is formed at least on each of the pair of thin plate sections 12a, 12b.

In the embodiment of the present invention, each of the piezoelectric/electrostrictive layer 22 and the pair of electrodes 24, 26 has a multilayered structure. The first electrode 24 and the second electrode 26 are alternately stacked such that a comb-shaped cross section is obtained, and the first electrode 24 and the second electrode 26 are stacked with each other with the piezoelectric/electrostrictive layer 22 interposed therebetween. As a result, the piezoelectric/electrostrictive elements 18a, 18b is constructed in multiple stages in the multilayered structure. However, the present invention is not limited to the multilayered structure as described above. A single-layered structure is also applicable in this invention.

Figure 2:
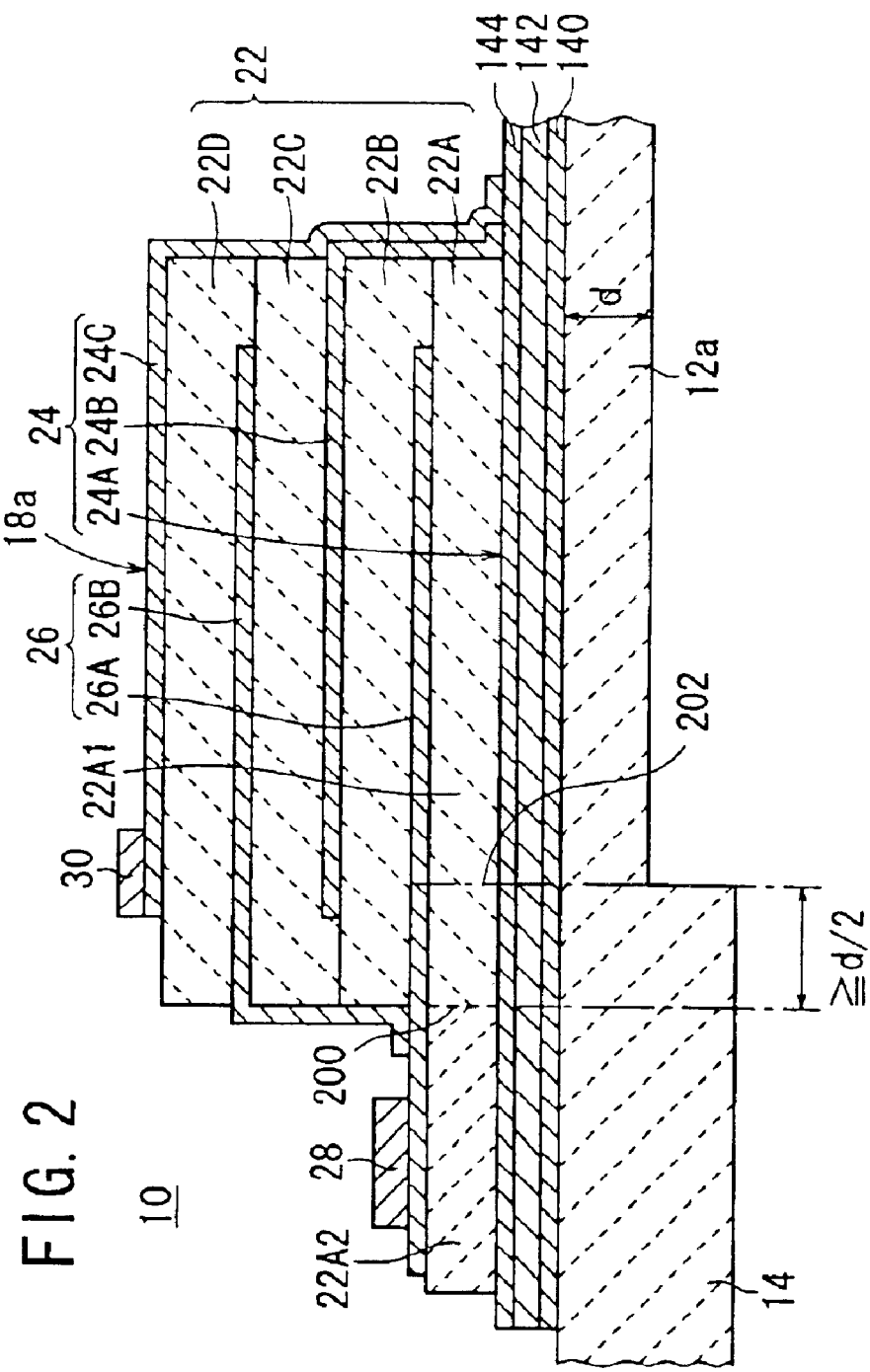
FIG. 2 is a magnified view illustrating a part of the piezoelectric/electrostrictive device of an embodiment according to the present invention in which a piezoelectric/electrostrictive element is formed.

As shown in a magnified view of FIG. 2, each of the piezoelectric/electrostrictive elements 18a, 18b includes the piezoelectric/electrostrictive layer 22 which has a four-layered structure (first to fourth layers of piezoelectric/electrostrictive layer 22A to 22D). In FIG. 2, the electrode 24 comprises first, third, and fifth wiring patterns 24A, 24B, 24C, and the electrode 26 comprises second and fourth wiring patterns 26A, 26B.

The stacked structure of the electrodes 24, 26 and the piezoelectric/electrostrictive layer 22 will be specifically explained principally referring to a structure of the thin plate section 12a. At first, the first wiring pattern 24A is formed substantially continuously over respective side surfaces of the thin plate section 12a(12b), the movable section 20a (20b), and the fixed section 14 of the ceramic substrate 16. The first layer of piezoelectric/electrostrictive layer 22A is formed at a continuous portion ranging from the fixed section 14 to the thin plate section 12a on the first wiring pattern 24A. The same arrangement is adopted for the thin plate section 12b.

The first piezoelectric/electrostrictive layer 22A comprises a first section 22A1 made from a first piezoelectric/electrostrictive material which is formed from a part of the thin plate section 12a to a part of the fixed section 14, and a second section 22A2 made from a second piezoelectric/electrostrictive material which is formed on another part of the fixed section 14. The first section 22A1 is arranged next to and in contact with the second section 22A2. In the contact area between the first section 22A1 and the second section 22A2, the first section 22A1 may overlap with the second section 22A2. In the contact area, the first section 22A1 may be disposed on the upper or lower surface of the second section 22A2. It is desirable that the length of the contact area is 300 $\mu$m. The selection of the first and second piezoelectric/electrostrictive materials will be described later.

In this embodiment, the first wiring pattern 24A has a three-layered structure. Specifically, the first wiring pattern 24A has a first layer 140 which is directly formed on the thin plate section 12a and which is made from a cermet of a substrate material and an electrode material, a second layer 142 which is formed on the first layer 140 and which is made from an electrode material, and a third layer 144 which is formed on the second layer 142 and which is made from a cermet of a piezoelectric/electrostrictive material and the electrode material.

The stacked structure of the electrodes 24, 26 and the piezoelectric/electrostrictive layer 22 will be further explained. The second wiring pattern 26A is formed on the first layer of piezoelectric/electrostrictive layer 22A. The second layer of piezoelectric/electrostrictive layer 22B is formed over a portion corresponding to the first section 22A1 of the first layer of piezoelectric/electrostrictive layer 22A so that a part (comb tooth portion) of the second wiring pattern 26A is included. The third wiring pattern 24B is formed on the second layer of piezoelectric/electrostrictive layer 22B and is electrically connected to the first wiring pattern 24A. The third layer of piezoelectric/electrostrictive layer 22C is formed over a portion corresponding to the first section 22A1 of the first layer of piezoelectric/electrostrictive layer 22A so that a part (comb tooth portion) of the third wiring pattern 24B is included.

Further, the fourth wiring pattern 26B is formed on the third layer of piezoelectric/electrostrictive layer 22C and is electrically connected to the second wiring pattern 26A.

The fourth layer of piezoelectric/electrostrictive layer 22D is formed over a portion corresponding to the first section 22A1 of the first layer of piezoelectric/electrostrictive layer 22A so that a part (comb tooth portion) of the fourth wiring pattern 26B is included. The fifth wiring pattern 24C is formed on the fourth layer of piezoelectric/ electrostrictive layer 22D and is electrically connected to the first wiring pattern 24A.

A first connecting terminal 28 is formed on a portion of the second wiring pattern 26A which is not the comb tooth portion, i.e., on a portion corresponding to the second section 22A2 of the first layer of piezoelectric/ electrostrictive layer 22A. A second connecting terminal 30 is formed at an end of the fifth wiring pattern 24C.

Therefore, the portion of the stacked structure of the piezoelectric/electrostrictive element 18a (18b as well), which corresponds to the first section 22A1 of the first layer of piezoelectric/electrostrictive layer 22A, can be defined as a substantial operating section which functions as an actual driving section (or a sensing section).

In this embodiment, the fifth wiring pattern 24C of the uppermost layer of the first electrode 24 is made from a resinate which is an electrode material. Each of the wiring patterns (second to fourth wiring patterns 26A, 24B, 26B) of the respective electrodes 24, 26, which is formed inside of the piezoelectric/electrostrictive element 18a (18b as well), is obtained by sintering a cermet film containing an electrode material and a piezoelectric/electrostrictive material.

In this arrangement, the volume ratio between the electrode material and the piezoelectric/electrostrictive material is preferably 4:6 through 9:1, because it is necessary that the second to fourth wiring patterns 26A, 24B, 26B function as conductor layers. The volume of each material is defined as weight divided by true density. If the volume ratio of the electrode material is smaller than 4, it is difficult to function as a conductor. If the volume ratio of the electrode material is larger than 9, it is difficult to thin the electrode and also the adhesion force against the piezoelectric/electrostrictive layer may be reduced. The blending condition described above allows respective intermediate patterns to be formed as conductor layers each of which is not more than 2 $\mu$m. Further, the conductor layers are prevented from partly lacking and defects are avoided. It is possible to obtain a pattern as designed substantially exactly.

Next, explanation will be made with reference to FIGS. 3 to 10B for a method of producing the piezoelectric/ electrostrictive device 10 of this embodiment. At first, the following definitions are made. A ceramic green laminate 58 is defined as a laminate which is obtained by laminating ceramic green sheets (see, for example, FIG. 4). A ceramic laminate 60 is defined as a product which is obtained by sintering the ceramic green laminate 58 into one unit (see, for example, FIG. 5). A ceramic substrate 16 is defined as a product which is obtained by cutting unnecessary portions off from the ceramic laminate 60 to integrally have the movable sections 20a, 20b the thin plate sections 12a, 12b, and the fixed section 14 (see FIG. 1).

In this production method, the ceramic laminate 60 is cut into chip units so that a large number of piezoelectric/ electrostrictive devices 10 are produced. In this method, it is supposed that a plurality of piezoelectric/electrostrictive devices 10 are arranged in a vertical direction and in a lateral direction respectively in one substrate. However, in order to simplify the explanation, the following description will be made assuming that one piezoelectric/electrostrictive device 10 is produced.

At first, a binder, a solvent, a dispersing agent, a plasticizer, and other components are added and mixed with a ceramic powder such as zirconia to prepare a slurry. The slurry is subjected to a defoaming treatment to prepare a ceramic green sheet having a predetermined thickness by a method such as the reverse roll coater method or the doctor blade method.

Figure 3:
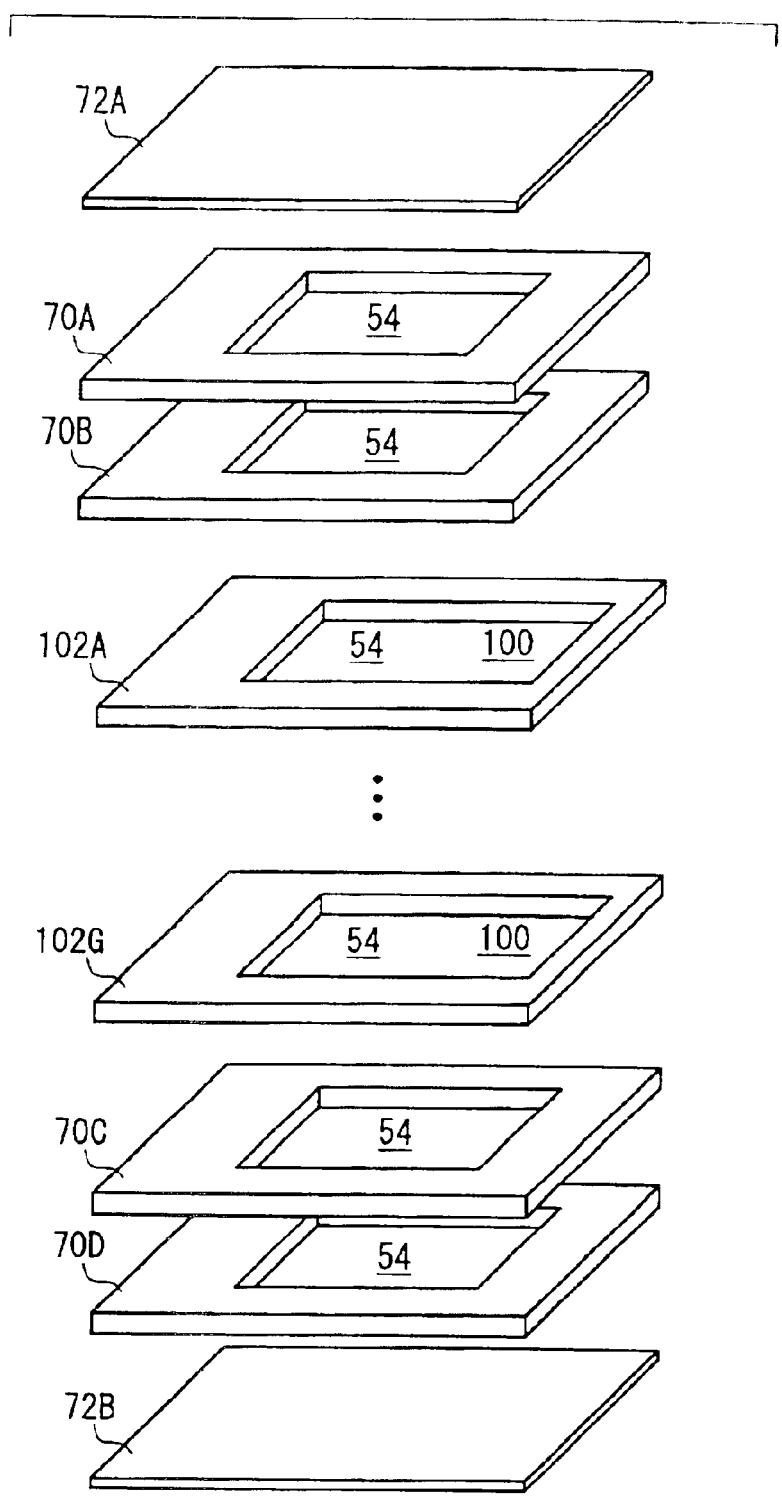
FIG. 3 illustrates a process for laminating necessary ceramic green sheets.

Subsequently, the ceramic green sheet is processed to have a variety of shapes as shown in FIG. 3 by a method such as laser machining or punching out by using a mold to obtain a plurality of ceramic green sheets 70A to 70D, 72A, 72B, 102A to 102G for forming a substrate.

The ceramic green sheets 70A to 70D are a plurality of (for example, two) ceramic green sheets which are provided with windows 54 for forming the movable section 20a, 20b having the end surface 34a, 34b of the piezoelectric/ electrostrictive device 10. The ceramic green sheets 102A to 102G are a plurality of (for example, four) sheets which are formed with windows 100 for forming a space at least between the thin plate sections 12a, 12b. The numbers of the ceramic green sheets are referred to by way of example.

Figure 4:
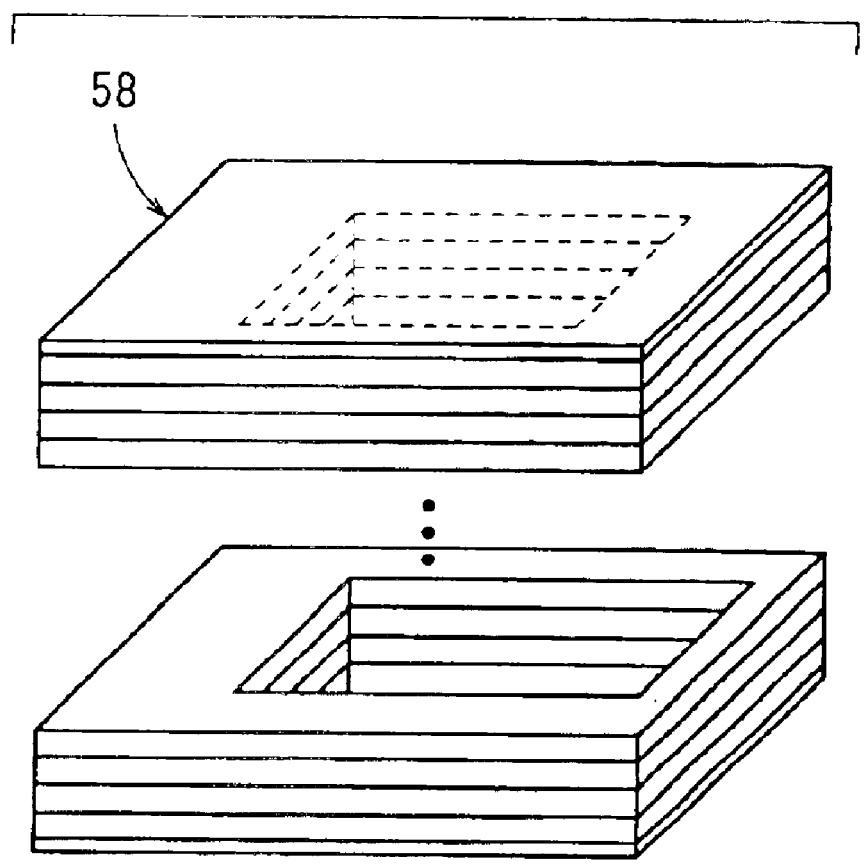
FIG. 4 shows that the ceramic green sheets are laminated to provide a ceramic green laminate.

As shown in FIG. 4, the ceramic green sheets 70A to 70D, 72A, 72B, 102A to 102G are further laminated so that the ceramic green sheets 70A to 70D, 102A to 102G are interposed between the ceramic green sheets 72A, 72B, followed by fixing to each other under pressure to prepare a ceramic green laminate 58. The ceramic green sheets 70A to 70D, 72A, 72B, 102A to 102G are laminated while the ceramic green sheets 102A to 102G are arranged at the center of the laminated sheet.

During this process, no pressure may be applied to certain portions during fixing under pressure due to the window 100. Therefore, it is necessary that the order of the lamination or the fixing under pressure may be changed for avoiding such portions. After that, the ceramic green laminate 58 is sintered to obtain a ceramic laminate 60 (see FIG. 5).

Figure 5:
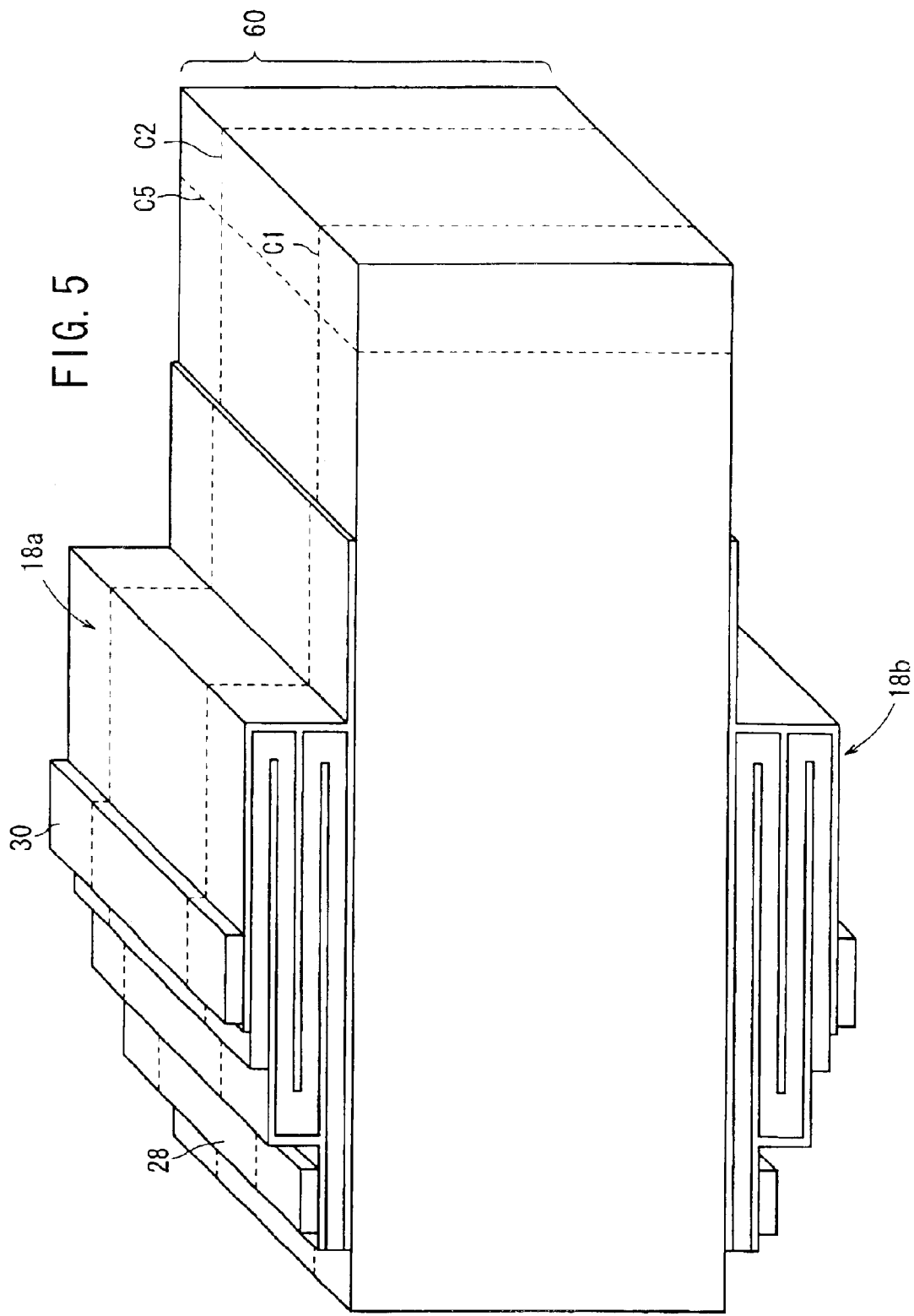
FIG. 5 shows that the ceramic green laminate is sintered to provide a ceramic laminate, and then the piezoelectric/electrostrictive elements are formed on the ceramic laminate.

Subsequently, as shown in FIG. 5, the piezoelectric/ electrostrictive elements 18a, 18b each having the multilayered structure are formed on both surfaces of the ceramic laminate 60. Both surfaces correspond to sides on which the ceramic green sheets 72A, 72B are laminated. The piezoelectric/electrostrictive elements 18a, 18b are integrated with the ceramic laminate 60 by the sintering. It is a matter of course that the piezoelectric/electrostrictive element 18a or 18b may be formed on only one surface of the ceramic laminate 60.

Explanation will now be made in detail with reference to FIGS. 6A to 10B for a process of forming the piezoelectric/ electrostrictive element 18a having the multilayered structure on one surface of the ceramic laminate 60. The process for forming the piezoelectric/electrostrictive element 18b is the same as that for the piezoelectric/electrostrictive element 18a, duplicate explanation of which is omitted herein.

Figure 6A:
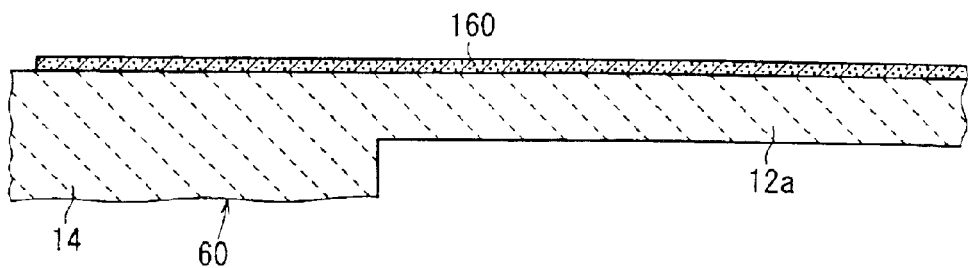
FIG. 6A is a process chart showing that a first cermet layer to be a first layer of a first wiring pattern is formed.
Figure 6B:
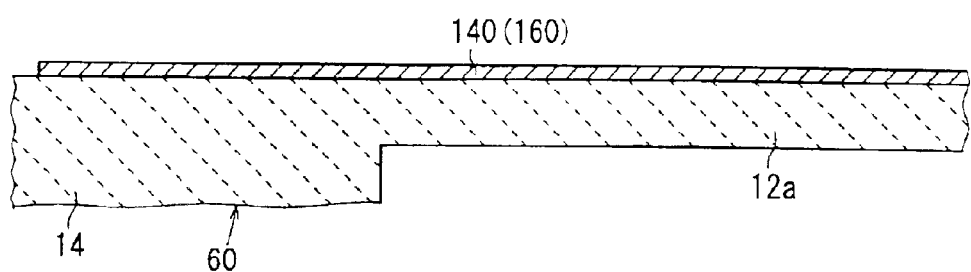
FIG. 6B is a process chart showing that the first layer is formed.

At first, as shown in FIG. 6A, a first cermet layer 160 made from Pt/zirconia is formed on one surface of the ceramic laminate 60 by the screen printing, for example. The thickness of the first cermet layer 160 is set so that the thickness after the sintering is about 0.5 to 5 $\mu$m. Then, as shown in FIG. 6B, a first layer 140 (first layer of the first wiring pattern 50) made from the first cermet layer 160 is formed by a sintering treatment in which a temperature of 1000 to 1400° C. is kept for about 0.5 to 3 hours.

Figure 6C:
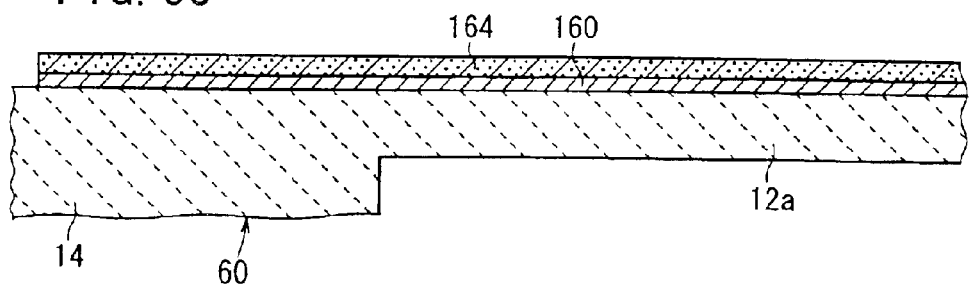
FIG. 6C is a process chart showing that a Pt paste to be a second layer of the first wiring pattern is formed.

Subsequently, as shown in FIG. 6C, for example, a Pt paste 164 is formed on the first layer 140 by the screen printing. In this case, the thickness of the Pt paste 164 is set so that the thickness after the sintering is 2 to 5 $\mu$m.

Figure 7A:
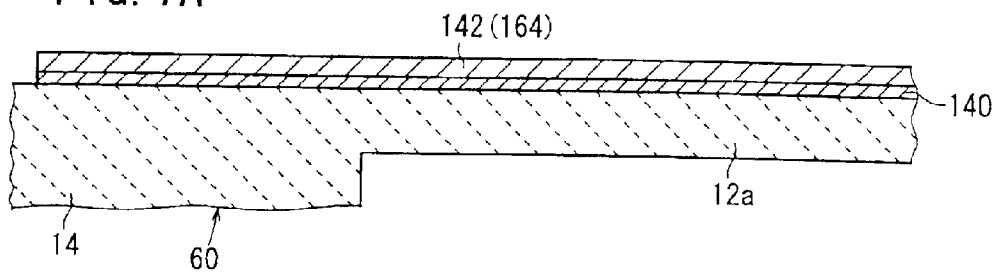
FIG. 7A is a process chart showing that the second layer is formed.

Further, as shown in FIG. 7A, a second layer 142 (second layer of the first wiring pattern 24A) made from the Pt paste 164 is formed by a sintering treatment in which a temperature of 1000 to 1400° C. is kept for about 0.5 to 3 hours.

Figure 7B:
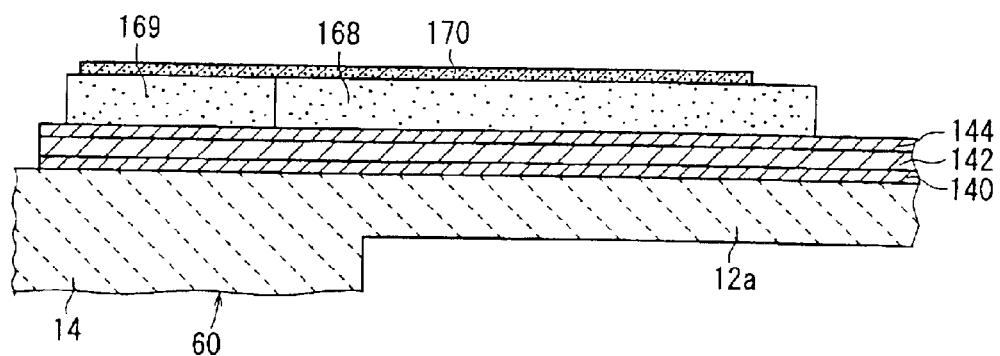
FIG. 7B is a process chart showing that a third layer of the first wiring pattern, pastes of first and second piezoelectric/electrostrictive materials to be a first layer of piezoelectric/electrostrictive layer, and a fourth cermet layer to be a second wiring pattern are formed.

After that, as shown in FIG. 7B, a third cermet layer 166 made from Pt/PZT is formed on the second layer 142 by the screen printing, for example. In this case, the thickness of the third cermet layer 166 is set so that the thickness after the sintering is 0.5 to 5 μm.

The third cermet layer 166 does not require conductivity, because Pt of the second layer 142 functions as the electrode. Therefore, the blending ratio can be freely chosen even within a range in which the cermet has no conductivity. The volume ratio is preferably set to be within a range of 3:7 to 7:3, because adhesive force can be increased against both of Pt in the second layer 142 described above and the first layer of piezoelectric/electrostrictive layer 22A (formed later). This setting may be also made for the first cermet layer 160 in the same manner as described above.

Subsequently, a paste 168 made from the first piezoelectric/electrostrictive material is formed, e.g., by the screen printing over a range from a part of the thin plate section 12a to a part of the fixed section 14 on the third cermet layer 166. In this case, the thickness of the paste 168 made from the first piezoelectric/electrostrictive material is set so that the thickness after the sintering is 5 to 25 μm.

Further, a paste 169 made from the second piezoelectric/electrostrictive material, is formed, e.g., by the screen printing on a portion of the third cermet layer 166 which corresponds to the fixed section 14 and on which the paste 168 is not formed. In this case, the thickness of the paste 169 made from the second piezoelectric/electrostrictive material is set so that the thickness after the sintering is 5 to 25 μm. Subsequently, a fourth cermet layer 170 made from Pt/PZT and converted into the second wiring pattern 26A later, is formed by the screen printing over a range on the pastes 168, 169 made from the first and second piezoelectric/electrostrictive materials, for example. In this case, the thickness of the fourth cermet layer 170 is set so that the thickness after the sintering is 1 to 5 μm.

Figure 7C:
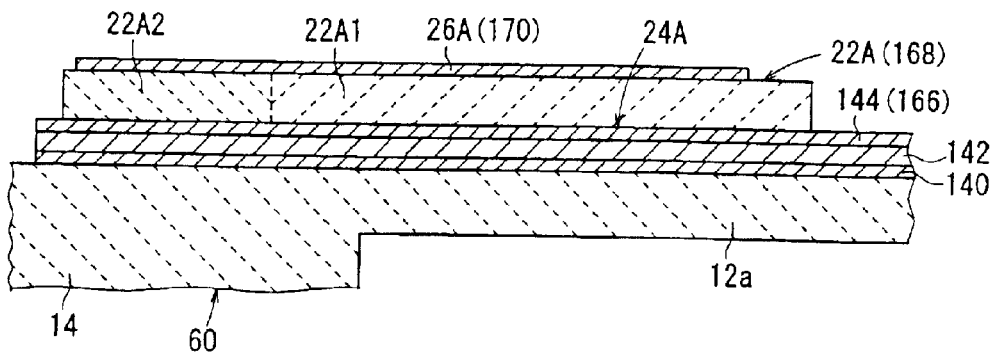
FIG. 7C is a process chart showing that the third layer, the first layer of piezoelectric/electrostrictive layer, and the second wiring pattern are simultaneously formed.

Then, as shown in FIG. 7C, a third layer 144 (third layer of the first wiring pattern 24A) made from the third cermet layer 166, the first layer of piezoelectric/electrostrictive layer 22A (first section 22A1 and second section 22A2) made from the pastes 168, 169 of the first and second piezoelectric/electrostrictive materials, and the second wiring pattern 26A made from the fourth cermet layer 170 are formed by a sintering treatment. In the sintering treatment, a temperature of 1000 to 1400° C. is kept for about 0.5 to 3 hours.

Figure 8A:
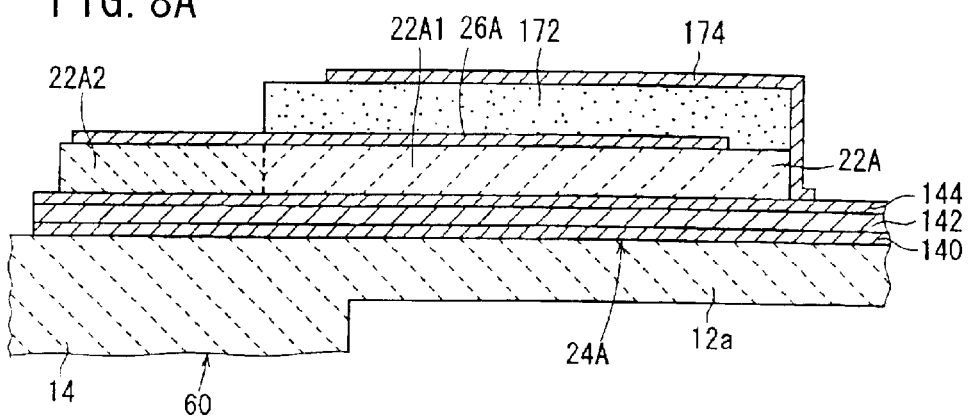
FIG. 8A is a process chart showing that a PZT paste to be a second layer of piezoelectric/electrostrictive layer and a fifth cermet layer to be a third wiring pattern are formed.

After that, as shown in FIG. 8A, for example, a PZT paste 172 is formed by the screen printing on a part of the second wiring pattern 26A corresponding to the first section 22A1 of the first layer of piezoelectric/electrostrictive layer 22A. In this case, the thickness of the PZT paste 172 is set so that the thickness after the sintering is 5 to 25 μm.

Subsequently, a fifth cermet layer 174 made from Pt/PZT and converted into the third wiring pattern 24B later, is formed by the screen printing over a range from the PZT paste 172 to the first wiring pattern 24A on the thin plate section 12a, for example. In this case, the thickness of the fifth cermet layer 174 is set so that the thickness after the sintering is 1 to 5 μm.

Figure 8B:
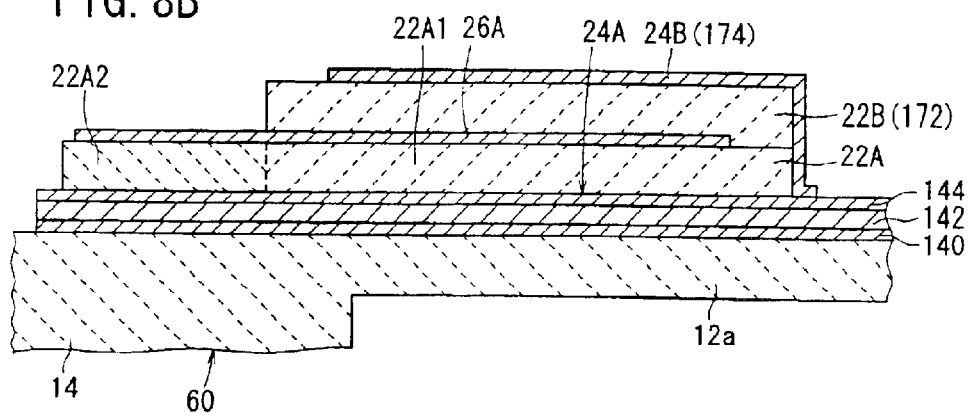
FIG. 8B is a process chart showing that the second layer of piezoelectric/electrostrictive layer and the third wiring pattern are simultaneously formed.

After that, as shown in FIG. 8B, the second layer of piezoelectric/electrostrictive layer 22B made from the PZT paste 172 and the third wiring pattern 24B made from the fifth cermet layer 174 are formed by a sintering treatment. In the sintering treatment, a temperature of 1000 to 1400° C. is kept for about 0.5 to 3 hours.

Figure 8C:
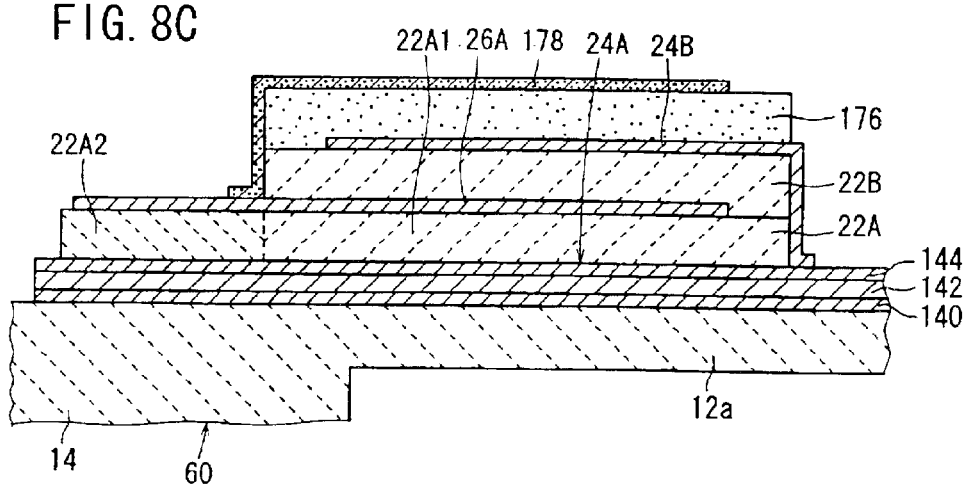
FIG. 8C is a process chart showing that a PZT paste to be a third layer of piezoelectric/electrostrictive layer and a sixth cermet layer to be a fourth wiring pattern are formed.

Then, as shown in FIG. 8C, for example, a PZT paste 176 is formed by the screen printing on the third wiring pattern 24B and on the exposed second layer of piezoelectric/ electrostrictive layer 22B. In this case, the thickness of the PZT paste 176 is set so that the thickness after the sintering is 5 to 25 μm.

Subsequently, a sixth cermet layer 178 made from, for example, Pt/PZT and converted into the fourth wiring pattern 26B later, is formed by the screen printing over a range from the PZT paste 172 to the second wiring pattern 26A on the second section 22A2 of the first layer of piezoelectric/ electrostrictive layer 22A. The thickness of the sixth cermet layer 178 is set so that the thickness after the sintering is 1 to 5 μm.

Figure 9A:
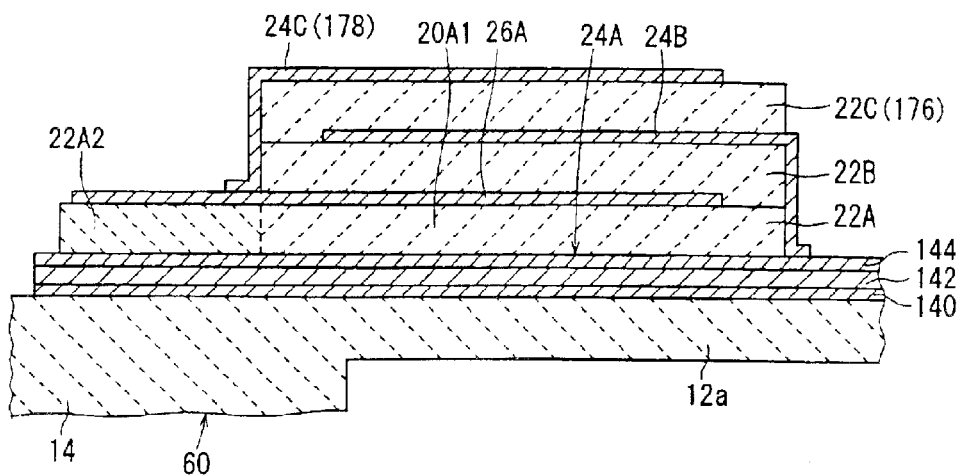
FIG. 9A is a process chart showing that the third layer of piezoelectric/electrostrictive layer and the fourth wiring pattern are simultaneously formed.

As shown in FIG. 9A, the third layer of piezoelectric/ electrostrictive layer 22C which is made from the PZT paste 176 and the fourth wiring pattern 26B made from the sixth cermet layer 178 are formed by performing a sintering treatment. In the sintering treatment, a temperature of 1000 to 1400° C. is kept for about 0.5 to 3 hours.

Figure 9B:
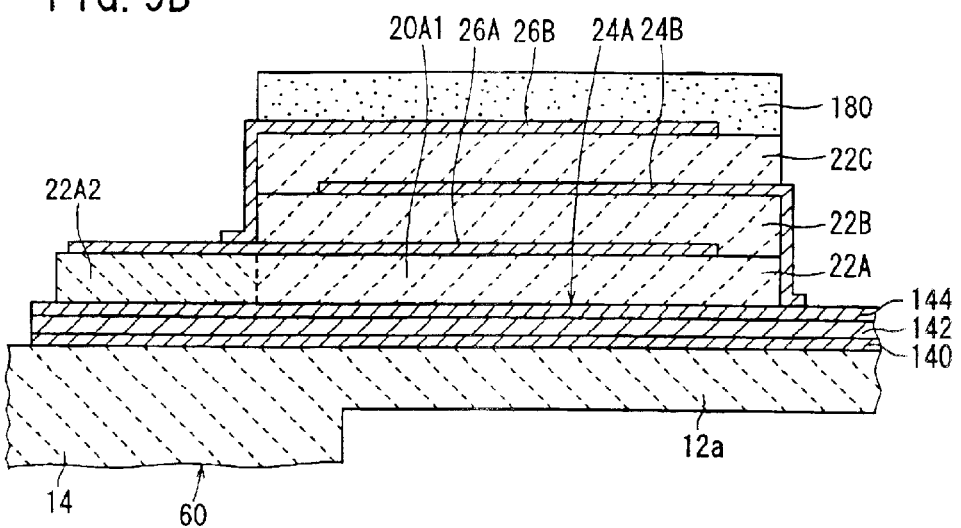
FIG. 9B is a process chart showing that a PZT paste to be a fourth layer of piezoelectric/electrostrictive layer is formed.

As shown in FIG. 9B, for example, a PZT paste 180 is formed by the screen printing on the fourth wiring pattern 26B and on the exposed third layer of piezoelectric/ electrostrictive layer 22C. The thickness of the PZT paste 180 is set so that the thickness after the sintering is 5 to 25 μm.

Figure 10A:
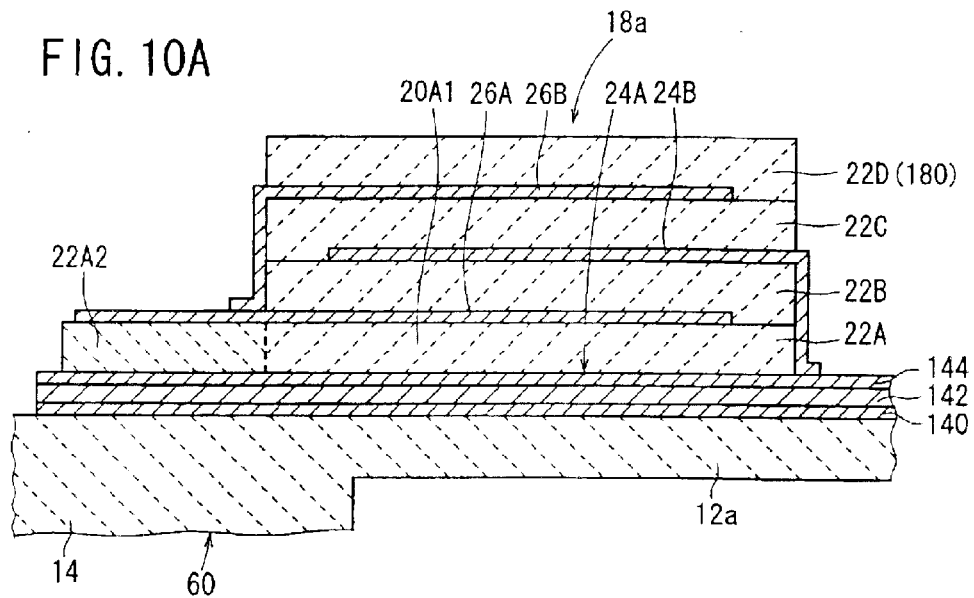
FIG. 10A is a process chart showing that the fourth layer of piezoelectric/electrostrictive layer is formed.

As shown in FIG. 10A, the fourth layer of piezoelectric/ electrostrictive layer 22D made from the PZT paste 180 is formed by performing a sintering treatment. In the sintering treatment, a temperature of 1000 to 1400° C. is kept for about 0.5 to 3 hours.

Figure 10B:
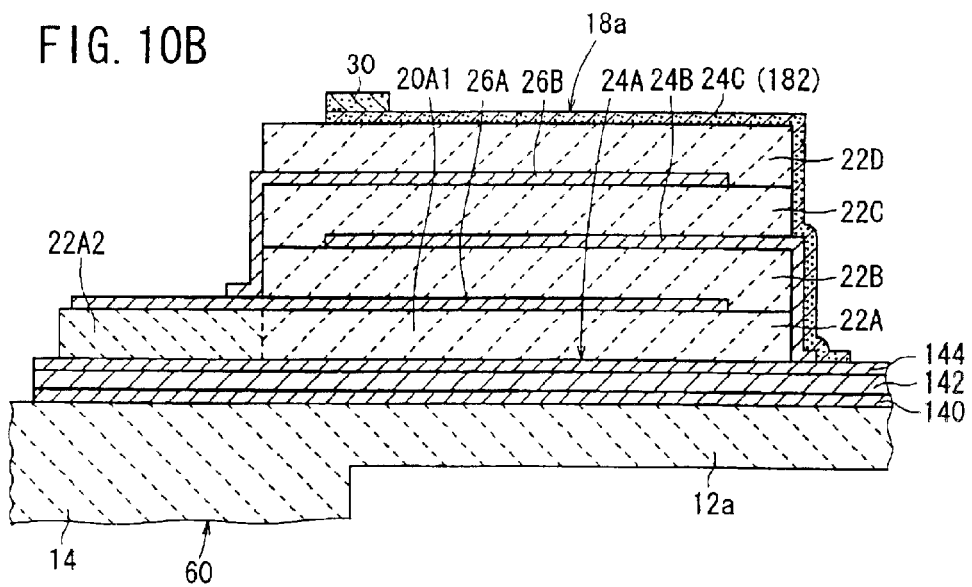
FIG. 10B is a process chart showing that a Pt resinate to be a fifth wiring pattern and an Au paste to be a terminal are formed.
Figure 11:
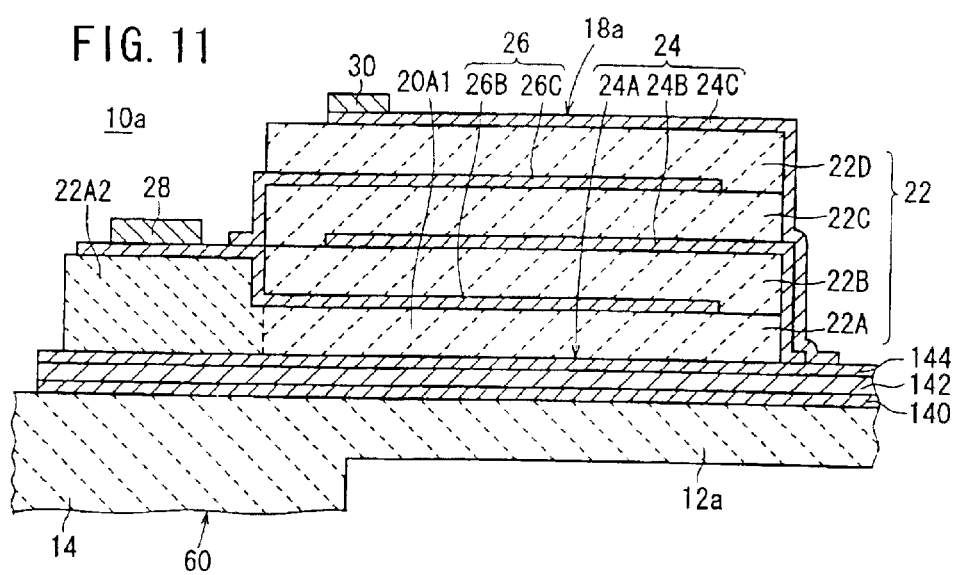
FIG. 11 is a magnified view illustrating a part of a modified embodiment of the piezoelectric/electrostrictive device of the embodiment according to the present invention in which a piezoelectric/electrostrictive element is formed.

As shown in FIG. 10B, for example, a Pt resinate 182 which is converted into the fifth wiring pattern 24C later, is formed by the screen printing over a range from the fourth layer of piezoelectric/electrostrictive layer 22D to the first wiring pattern 24A on the thin plate section 12a. In this case, the thickness of the Pt resinate 182 is set so that the thickness after the sintering is 0.1 to 3 μm.

Subsequently, Au pastes 184, 186, which are converted into the first connecting terminal 28 and the second connecting terminal 30 later, respectively, are formed by the screen printing on the exposed second wiring pattern 26A and on the end of the Pt resinate 182.

The fifth wiring pattern 24C made from the Pt resinate 182 and the first and second connecting terminals 28, 30 made from the Au pastes 184, 186 are formed by performing a sintering treatment. In the sintering treatment, a temperature of 500 to 1000° C. is kept for about 0.5 to 3 hours. Accordingly, as shown in FIGS. 2 and 5, the piezoelectric/ electrostrictive element 18a having the multilayered structure is formed on one surface of the ceramic laminate 60. The piezoelectric/electrostrictive element 18b having the multilayered structure is also formed on the other surface of the ceramic laminate 60 in a similar method to the above.

Subsequently, as shown in FIG. 5, side portions and an end portion of the ceramic laminate 60 are cut off, along cutting lines C1, C2, C5. The ceramic laminate 60 has the piezoelectric/electrostrictive elements 18a, 18b. As a result of the cutoff, as shown in FIG. 1, the piezoelectric/ electrostrictive device 10 is obtained, in which the piezoelectric/electrostrictive elements 18a, 18b are formed on the ceramic substrate 16, and the movable sections 20a, 20b having the mutually opposing end surfaces 34a, 34b are formed.

Several orders of cutting are applicable. That is, the cutting may be performed along the cutting line C5 after performing the cutting along the cutting lines C1, C2. Alternatively, the cutting may be performed along the cutting lines C1, C2 after performing the cutting along the cutting line C5. Of course, these cutting operations may be performed simultaneously. The end surface of the fixed section 14 opposed to the cutting line C5 may be appropriately cut. After cutting, scraps or the like resulting from the cutting are removed by, for example, ultrasonic cleaning.

Next, the respective constituents of the piezoelectric/electrostrictive device 10 of this embodiment will be explained.

As described above, the movable sections 20a, 20b are operated based on the driving amounts of the thin plate sections 12a, 12b. A variety of members are attached to the movable sections 20a, 20b depending on the use of the piezoelectric/electrostrictive device 10. For example, when the piezoelectric/electrostrictive device 10 is used as a displacement element, a shield plate or the like for an optical shutter is attached. Especially, when the piezoelectric/electrostrictive device 10 is used for the positioning of a magnetic head of a hard disk drive or for a ringing-suppressing mechanism, a member required to be positioned including a magnetic head, a slider provided with a magnetic head, and a suspension provided with a slider is attached.

As described above, the fixed section 14 supports the thin plate sections 12a, 12b and the movable sections 20a, 20b. For example, when the piezoelectric/electrostrictive device 10 is utilized to position a magnetic head of a hard disk drive as described above, the fixed section 14 is supported and secured, for example, to a carriage arm attached to VCM (voice coil motor) or a suspension or a fixed plate attached to the carriage arm. Accordingly, the entire piezoelectric/electrostrictive device 10 is fixed. Further, as shown in FIG. 1, the connecting terminals 28, 30 and other members for driving the piezoelectric/electrostrictive elements 18a, 18b may be arranged on the fixed section 14.

The materials of the movable sections 20a, 20b and the fixed section 14 are not specifically limited as long as the materials have certain rigidity. However, the ceramics, to which the ceramic green sheet-laminating method is applicable, can be preferably used as described above.

Specifically, proposed materials include a major component such as zirconia represented by fully stabilized zirconia or partially stabilized zirconia, alumina, magnesia, silicon nitride, aluminum nitride, or titanium oxide. Further, materials containing a mixture of the foregoing compounds as a major component are also proposed. However, it is especially preferable to use a material containing fully stabilized zirconia as a major component or a material containing partially stabilized zirconia as a major component, in view of the high mechanical strength and high toughness.

As described above, the thin plate sections 12a, 12b are driven in accordance with the displacement of the piezoelectric/electrostrictive elements 18a, 18b. Each of the thin plate sections 12a, 12b is a thin plate-shaped member having flexibility. The thin plate sections 12a, 12b amplify the expansion and shrink displacement of the piezoelectric/electrostrictive elements 18a, 18b arranged on the surface thereof and transmit the bending displacement to the movable sections 20a, 20b. Therefore, the shape and the material quality of the thin plate sections 12a, 12b are selected considering flexibility and mechanical strength thereof so as not to be broken due to bending. The shape and the material quality of the thin plate sections 12a, 12b may also be appropriately selected in consideration of the response performance and the operability of the movable section 12a, 12b.

Similar ceramic materials can be preferably used for the material of the thin plate sections 12a, 12b, to the ceramic materials of the movable sections 20a, 20b and the fixed section 14. A material containing fully stabilized zirconia as a major component, or a material containing partially stabilized zirconia as a major component is used most preferably, because mechanical strength is large even when a thin-walled member is formed therefrom, toughness is high, and the reactivity with the piezoelectric/electrostrictive layer and the electrode material is small.

The fully stabilized zirconia and the partially stabilized zirconia are preferably fully stabilized or partially stabilized as follows. Chemical compounds which fully stabilize and/or partially stabilize zirconia include yttrium oxide, ytterbium oxide, cerium oxide, calcium oxide, and magnesium oxide. Zirconia can be stabilized by at least one of the foregoing compounds, or by the foregoing compounds in combination as well.

It is desirable that the compounds are added in the following amounts, i.e., 1 to 30 mole %, preferably 1.5 to 10 mole % in the case of yttrium oxide or ytterbium oxide, 6 to 50 mole %, preferably 8 to 20 mole % in the case of cerium oxide, and 5 to 40 mole %, preferably 5 to 20 mole % in the case of calcium oxide or magnesium oxide. Among them, it is especially preferable to use yttrium oxide as a stabilizer. In this case, it is desirable that yttrium oxide is preferably added in a amount of 1.5 to 10 mole %, and more preferably 2 to 4 mole %. It is possible to add, for example, alumina, silica, and/or oxide of transition metal as an additive of a sintering aid or the like within a range of 0.05 to 20 % by weight. However, when the piezoelectric/electrostrictive elements 18a, 18b arc formed by sintering into one unit through the film formation method, it is also preferable to add, for example, alumina, magnesia, and/or oxide of transition metal as an additive.

In order to obtain high mechanical strength and stable crystal phase, it is desirable that the average crystal grain size of zirconia is 0.05 to 3 μm, preferably 0.05 to 1 μm. As described above, ceramic materials which are similar to those of the movable sections 20a, 20b and the fixed section 14 can be used for the thin plate sections 12a, 12b. It is preferable that the thin plate sections 12a, 12b are made by using substantially the same material. This is advantageous in that the reliability of the joined portions is improved, the strength of the piezoelectric/electrostrictive device 10 is enhanced, and the complexity of production is reduced.

Each of the piezoelectric/electrostrictive elements 18a, 18b has at least the piezoelectric/electrostrictive layer 22 and the pair of electrodes 24, 26 for applying the electric field to the piezoelectric/electrostrictive layer 22. The piezoelectric/electrostrictive elements 18a, 18b, can be used as a unimorph type or a bimorph type. However, the piezoelectric/electrostrictive element of the unimorph type, which is used with the thin plate sections 12a, 12b, is more excellent in stability of the generated displacement amount, and it is more advantageous to reduce weight of the device. Therefore, the piezoelectric/electrostrictive element of the unimorph type is more suitable for the piezoelectric/electrostrictive device 10.

It is preferable that the piezoelectric/electrostrictive elements 18a, 18b are formed on the side surfaces of the thin plate sections 12a, 12b as shown in FIG. 1, since the thin plate sections 12a, 12b can be driven more greatly.

Piezoelectric ceramic materials are preferably used for the piezoelectric/electrostrictive layer 22. However, it is also possible to use electrostrictive ceramic materials, ferroelectric ceramic materials, and anti-ferroelectric ceramic materials. When the piezoelectric/electrostrictive device 10 is used to position the magnetic head of the hard disk drive, for example, it is preferable to use a piezoelectric material having small strain hysteresis and/or a material having a coercive electric field of not more than 10 kV/mm, because the linearity between the displacement amount of the movable section 20a, 20b and the driving voltage or the output voltage is important.

Specifically, piezoelectric materials may include lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuthtantalate. One of these materials can be used or any appropriate mixture of these can be used.

Especially, a material containing lead zirconate, lead titanate, or lead magnesium niobate as a major component, or a material containing sodium bismuth titanate as a major component is preferably used, since such materials have a high electromechanical coupling factor and a high piezoelectric constant. Further, the reactivity with the thin plate section (ceramics) 12a, 12b of such materials is small when the piezoelectric/electrostrictive layer 22 is sintered so that a device of a stable composition can be obtained.

It is also possible to use a ceramic material obtained by adding to the piezoelectric material described above any one of or a mixture of, for example, oxide of lanthanum, oxide of calcium, oxide of strontium, oxide of molybdenum, oxide of tungsten, oxide of barium, oxide of niobium, oxide of zinc, oxide of nickel, oxide of manganese, oxide of cerium, oxide of cadmium, oxide of chromium, oxide of cobalt, oxide of antimony, oxide of iron, oxide of yttrium, oxide of tantalum, oxide of lithium, oxide of bismuth, and oxide of stannum.

For example, when lanthanum and/or strontium is contained in major components such as lead zirconate, lead titanate, and lead magnesium niobate, coercive electric field and piezoelectric characteristics are adjustable.

It is desirable to add a material such as silica which tends to form glass not more than 2% by weight of the piezoelectric/electrostrictive material. If the material such as silica, which serves as a sintering aid, is added not less than 2% by weight, the material is readily reacted with the piezoelectric/electrostrictive material during the heat treatment of the piezoelectric/electrostrictive layer 22. As a result, composition is varied, and piezoelectric characteristics are deteriorated. If a suitable amount of silica is added to the piezoelectric/electrostrictive material, sintering characteristics of the piezoelectric/electrostrictive member are improved, i.e., the piezoelectric/electrostrictive material may be sintered evenly.

As for the second piezoelectric/electrostrictive material of the second section 22A2 of the first layer of piezoelectric/electrostrictive layer 22A, it is preferable to satisfy the following requirements.

(1) The second piezoelectric/electrostrictive material is an insulator.

(2) The second piezoelectric/electrostrictive material is a ceramic, because the second piezoelectric/electrostrictive material is co-fired with the first piezoelectric/electrostrictive material of the first section 22A1.

(3) The coefficient of thermal expansion of the second piezoelectric/electrostrictive material, is approximate to that of the first piezoelectric/electrostrictive material, because the second piezoelectric/electrostrictive material is introduced in a thermal step.

(4) The composition of the second piezoelectric/electrostrictive material is approximate to that of the first piezoelectric/electrostrictive material, because the second piezoelectric/electrostrictive material directly contacts the first piezoelectric/electrostrictive material.

(5) The movement of elements from the first piezoelectric/electrostrictive material to the second piezoelectric/electrostrictive material scarcely occurs, and also the movement of elements to the first piezoelectric/electrostrictive material therefrom scarcely occurs.

(6) The movement of elements from the second piezoelectric/electrostrictive material to the ceramic substrate 16 scarcely occurs, and also the movement of elements from the ceramic substrate 16 thereto scarcely occurs.

(7) Neither heterogeneous phase nor decomposition occurs as a result of the reaction with the first piezoelectric/electrostrictive material.

(8) When the first piezoelectric/electrostrictive material is PZT (lead titanate zirconate), the second piezoelectric/electrostrictive material is PZ (lead zirconate) or PT (lead titanate).

(9) When the first piezoelectric/electrostrictive material is PZT, then the second piezoelectric/electrostrictive material is PZT and has a piezoelectric constant lower than that of the first piezoelectric/electrostrictive material.

The piezoelectric constants are explained as follows. At first, the piezoelectric constant $|d_{31}|$ of the first piezoelectric/electrostrictive material is not less than $100 \times 10^{-12}$ m/V, preferably not less than $150 \times 10^{-12}$ m/V, and more preferably not less than $200 \times 10^{-12}$ m/V. The piezoelectric constant $|d_{31}|$ of the second piezoelectric/electrostrictive material is not more than $100 \times 10^{-12}$ m/V, preferably not more than $50 \times 10^{-12}$ m/V, and more preferably not more than $10 \times 10^{-12}$ m/V.

Of course, the second section 22A2 and the first section 22A1 of the first layer of piezoelectric/electrostrictive layer 22A may have different thicknesses from each other. In a piezoelectric/electrostrictive device 10a of a modified embodiment shown in FIG. 11, for example, it is preferable that the second section 22A2 is thicker than the first section 22A1. Specifically, the thickness of the second section 22A2 is not less than 5 μm, preferably not less than 10 μm, and more preferably not less than 15 μm. Accordingly, it is possible to ensure the voltage endurance of the second section 22A2. Further, this feature is advantageous since the electrostatic capacity value by the second section 22A2 can be smaller than the electrostatic capacity value by the first section 22A1.

As shown in FIG. 2, it is preferable that a boundary 200 between the first section 22A1 and the second section 22A2 is located on the fixed section 14, and that the boundary 200 is positioned at a distance of not less than d/2 from an intersection between an imaginary extension plane 202 of the inner wall surface of the fixed section 14 and the side surface of the thin plate section 12a provided that d represents a thickness of the thin plate section 12a (also applicable to the plate section 12b).

Considering the ease of control of the piezoelectric/electrostrictive element 18a, 18b, it is preferable that the second piezoelectric/electrostrictive material of the second section 22A2 has lower sensitivity to temperature change then that of the first piezoelectric/electrostrictive material of the first section 22A1. The sensitivity to temperature change will be represented by changes of the resistance value, the dielectric constant, the piezoelectric constant, the coefficient of thermal expansion, or the like, of the material when the temperature changes.

The pair of electrodes 24, 26 of the piezoelectric/electrostrictive element 18a, 18b are made of a metal which is solid at room temperature and which is excellent in conductivity. Materials usable for the pair of electrodes 24, 26 include metals such as aluminum, titanium, chromium, iron, cobalt, nickel, copper, zinc, niobium, molybdenum, ruthenium, palladium, rhodium, silver, stannum, tantalum, tungsten, iridium, platinum, gold, and lead, and alloys thereof. Further, it is also preferable to use a cermet material obtained by dispersing the same material of the piezoelectric/electrostrictive layer 22 or the thin plate sections 12a, 12b in one of the metals or the alloy described above.

The material of the electrodes 24, 26 of the piezoelectric/electrostrictive element 18a, 18b is selected depending on the method of forming the piezoelectric/electrostrictive layer 22. For example, when the piezoelectric/electrostrictive layer 22 is formed by the sintering on the electrode 24 after forming the electrode 24 on the thin plate section 12a, 12b, it is necessary to use a high melting point metal for the electrode 24 which does not change at the sintering temperature of the piezoelectric/electrostrictive layer 22. The high melting point metal includes platinum, palladium, platinum-palladium alloy, and silver-palladium alloy. However, the outermost electrode, which is formed on the piezoelectric/electrostrictive layer 22 after forming the piezoelectric/electrostrictive layer 22, can be formed at a relatively low temperature. Therefore, for the outermost electrode, it is possible to use a low melting point metal as a major component such as aluminum, gold, and silver.

Each thickness of the electrodes 24, 26 may be a factor for decreasing the displacement of the piezoelectric/electrostrictive element 18a, 18b considerably. Therefore, especially for the electrode to be formed after the sintering of the piezoelectric/electrostrictive layer 22, it is preferable to use an organic metal paste such as gold resinate paste, platinum resinate paste, and silver resinate paste so that a dense and thinner film can be obtained by sintering.

The piezoelectric/electrostrictive device 10 in this embodiment can be suitably used for a variety of sensors including ultrasonic wave sensors, acceleration sensors, angular velocity sensors, shock sensors, and mass sensors. The piezoelectric/electrostrictive device 10 in this embodiment is further advantageous since the sensitivity of the sensor can easily be adjusted by changing the size of an object to be attached between the end surfaces 34a, 34b or the thin plate sections 12a, 12b.

As for the method of producing the piezoelectric/electrostrictive device 10, usable methods include the screen printing method described above as well as a thick film formation method such as dipping, application, and electrophoresis and a thin film formation method such as ion beam method, sputtering, vacuum deposition, ion plating method, chemical vapor deposition (CVD), and plating, for forming the piezoelectric/electrostrictive element 18a, 18b on the surface of the ceramic laminate 60.

When the piezoelectric/electrostrictive elements 18a, 18b are formed by using one of the film formation methods as described above, the piezoelectric/electrostrictive elements 18a, 18b and the thin plate sections 12a, 12b can be joined and arranged integrally without using any adhesive. It is possible to ensure the reliability and the reproducibility of the device, and it is possible to facilitate integration thereof.

In this embodiment, it is preferable that the piezoelectric/electrostrictive elements 18a, 18b are formed by the thick film formation method, for the following reason. When the thick film formation method is used especially for the formation of the piezoelectric/electrostrictive layer 22, the film can be formed by using a paste, a slurry, a suspension, an emulsion, or a sol containing as a major component grains or powder of piezoelectric ceramics having an average grain size of 0.01 to 5 $\mu$m, preferably 0.05 to 3 $\mu$m. When the film obtained as described above is sintered, it is possible to obtain good piezoelectric/electrostrictive characteristics.

The electrophoresis method is advantageous since the film can be formed at a high density with a high shape accuracy. The screen printing method advantageously simplifies production steps, because the film formation and the pattern formation can be performed simultaneously.

The method of cutting the ceramic laminate 60 includes mechanical machining such as dicing machining and wire saw machining as well as electron beam machining and laser machining using YAG laser, excimer laser, or the like.

As described above, in the piezoelectric/electrostrictive device 10 of the embodiment according to the present invention, the piezoelectric/electrostrictive elements 18a, 18b are formed by alternately stacking one or more piezoelectric/electrostrictive layers 22 and one or more electrodes 24, 26 on the ceramic substrate 16. The piezoelectric/electrostrictive elements 18a, 18b have the first layer of piezoelectric/electrostrictive layer 22A comprising the first section 22A1 of the first piezoelectric/electrostrictive material and the second section 22A2 of the second piezoelectric/electrostrictive material. Therefore when it is assumed that the first connecting terminal 28 is formed on a part (portion corresponding to the second section 22A2) of the second wiring pattern 26A, the electrostatic capacity value constituted by the second section 22A2 can be smaller than the electrostatic capacity value by the first section 22A1.

As a result, since the electrostatic capacity is increased in a substantial operating section which functions as an actual driving section (or a sensing section), the amount of generated strain is increased in the piezoelectric/electrostrictive layer 22, and displacement is increased. Further, the electrostatic capacity is decreased in a portion corresponding to the second section 22A2 (which is not the substantial operating section) resulting in decrease in a CR time constant concerning the supply of an electric signal. For example, when the actuator sections 19a, 19b are used, it is possible to realize high speed operation of the actuator sections 19a, 19b.

In other words, in the embodiment according to the present invention, mechanical characteristics or electric characteristics can be changed between the substantial operating section and the other portion. For example, electrostatic capacity can be increased in the substantial operating section, and the electrostatic capacity can be decreased in the other portion. It is possible to realize optimum device characteristics depending on the use.

The piezoelectric/electrostrictive devices 10, 10a, described above can be utilized as sensor elements of various sensors including ultrasonic wave sensors, acceleration sensors, angular velocity sensors, shock sensors, and mass sensors, as well as active elements including various transducers, various actuators, frequency region functional parts (filters), transformers, and vibrators, resonators, oscillators, and discriminators for communication or power generation. Especially, the piezoelectric/electrostrictive devices 10, 10a can be preferably utilized for various actuators in mechanisms for adjusting displacement or positions of, or mechanisms for adjusting angles of various precision components in optical instruments and precision instruments.

It is a matter of course that the piezoelectric/electrostrictive device according to the present invention is not limited to the embodiments described above, which may be embodied in other various structures without deviating from the gist or essential characteristics of the present invention.

What is claimed is:

1. A piezoelectric/electrostrictive device comprising:
    a piezoelectric/electrostrictive element including one or more piezoelectric/electrostrictive layers and one or more electrode layers alternately laminated on a ceramic substrate, wherein
    at least one of said piezoelectric/electrostrictive layers includes two or more types of materials which are arranged next to each other.

2. The piezoelectric/electrostrictive device according to claim 1, wherein said two or more types of materials comprise two or more types of piezoelectric/electrostrictive materials which are arranged next to each other.

3. The piezoelectric/electrostrictive device according to claim 1, wherein
    said ceramic substrate includes a fixed section which has a large thickness, and a pair of thin plate sections which are formed continuously from said fixed section and each of which has a thickness smaller than that of said fixed section, and
    said piezoelectric/electrostrictive element is formed on a surface which includes at least a part of one thin plate section of said pair of thin plate sections.

4. The piezoelectric/electrostrictive device according to claim 3, wherein
    said piezoelectric/electrostrictive element formed on said surface including said part of at least one of said thin plate sections includes a first piezoelectric/electrostrictive material arranged over a region ranging from said part of said thin plate section to a part of said fixed section and a second piezoelectric/electrostrictive material arranged on another part of said fixed section, and
    a piezoelectric constant of said second piezoelectric/electrostrictive material is lower than a piezoelectric constant of said first piezoelectric/electrostrictive material.

5. The piezoelectric/electrostrictive device according to claim 4, wherein
    an absolute value of said piezoelectric constant of said first piezoelectric/electrostrictive material is not less than $100 \times 10^{-12}$ m/V, and
    an absolute value of said piezoelectric constant of said second piezoelectric/electrostrictive material is less than $100 \times 10^{-12}$ m/V.

6. The piezoelectric/electrostrictive device according to claim 5, wherein said absolute value of said piezoelectric constant of said second piezoelectric/electrostrictive material is not more than $50 \times 10^{-12}$ m/V.

7. The piezoelectric/electrostrictive device according to claim 6, wherein said absolute value of said piezoelectric constant of said second piezoelectric/electrostrictive material is not more than $10 \times 10^{-12}$ m/V.

8. The piezoelectric/electrostrictive device according to claim 4, wherein a dielectric constant of said second piezoelectric/electrostrictive material is not more than a dielectric constant of said first piezoelectric/electrostrictive material.

9. The piezoelectric/electrostrictive device according to claim 4, wherein sensitivity of said second piezoelectric/electrostrictive material to temperature change is lower than that of said first piezoelectric/electrostrictive material.

10. The piezoelectric/electrostrictive device according to claim 4, wherein a thickness of said layer of said second piezoelectric/electrostrictive material is not less than a thickness of said layer of said first piezoelectric/electrostrictive material.

11. The piezoelectric/electrostrictive device according to claim 4, wherein a boundary between said first piezoelectric/electrostrictive material and said second piezoelectric/electrostrictive material is located on said fixed section, and said boundary is positioned at a distance of not less than d/2 from an intersection between an imaginary extended plane of an inner wall surface of said fixed section and a side surface of said thin plate section provided that d represents a thickness of said thin plate section.

12. The piezoelectric/electrostrictive device according to claim 1, wherein said piezoelectric/electrostrictive element is constructed by laminating at least two or more of said piezoelectric/electrostrictive layers.

13. The piezoelectric/electrostrictive device according to claim 1, wherein another layer interposes between said ceramic substrate and said piezoelectric/electrostrictive layer.

14. The piezoelectric/electrostrictive device according to claim 3, wherein said fixed section and said thin plate sections of said ceramic substrate are constructed by sintering a ceramic green laminate into one ceramic laminate, and then cutting off unnecessary portions.

15. The piezoelectric/electrostrictive device according to claim 3, wherein said fixed section and said thin plate sections of said ceramic substrate are constructed by sintering a ceramic green laminate into one ceramic laminate, thereafter forming said piezoelectric/electrostrictive element on said ceramic laminate followed by sintering, and then cutting off unnecessary portions.

* * * * *